United States Patent [19]
Takado et al.

[11] Patent Number: 5,452,052
[45] Date of Patent: Sep. 19, 1995

[54] APPARATUS FOR EXPOSING CHEMICALLY AMPLIFIED RESIST

[75] Inventors: Hiroko Takado, Moriguchi; Yoshitaka Dansui, Neyagawa, both of Japan

[73] Assignee: Matsushita Electric Industrial Co., Ltd., Osaka, Japan

[21] Appl. No.: 34,888

[22] Filed: Mar. 19, 1993

[30] Foreign Application Priority Data

Mar. 25, 1992 [JP] Japan ................... 4-066767

[51] Int. Cl.6 ............................................. G03B 27/00
[52] U.S. Cl. ..................................... 355/53; 354/300
[58] Field of Search .............. 355/27, 53; 354/300; 141/65

[56] References Cited

U.S. PATENT DOCUMENTS

| | | | |
|---|---|---|---|
| 3,658,417 | 4/1972 | Lewis | 355/94 |
| 4,693,779 | 9/1987 | Okuhira | 156/638 |
| 4,704,348 | 11/1987 | Koizumi | 430/327 |

FOREIGN PATENT DOCUMENTS 61-101018  5/1986  Japan .
3173114   7/1991  Japan .

*Primary Examiner*—Kathleen Duda
*Attorney, Agent, or Firm*—Stevens, Davis, Miller & Mosher

[57] ABSTRACT

A method for exposing a chemically amplified resist on a semi-conductive substrate comprises the steps of removing a chemically active gas which is chemically active on the chemically amplified resist from an inside of a chamber receiving a light source, the chemically amplified resist and the semiconductor substrate, and exposing at least a part of the chemically amplified resist on the semiconductor substrate to a light from the light source means so that the chemically amplified resist reacts to the light from the light source and is prevented from reacting to the chemically active gas.

20 Claims, 2 Drawing Sheets

APPARATUS FOR EXPOSING CHEMICALLY AMPLIFIED RESIST

BACKGROUND OF THE INVENTION AND RELATED ART STATEMENT

The present invention relates to an apparatus and method for exposing a chemically amplified resist on a semiconductor substrate.

Publication of Japanese unexamined patent application shou-61-101018 discloses a resist exposing apparatus as shown in FIG. 2. An air is taken into a chamber 2 of the resist exposing apparatus through an air-supply port 3, after the air from an inlet 4 passes an air temperature and humidity adjuster 6 and a dust filter 7.

OBJECT AND SUMMARY OF THE INVENTION

An object of the present invention is to provide an apparatus and method for exposing a chemically amplified resist on a semiconductor substrate, by which apparatus and method, a correctly-shaped resist layer preferable for an etching-resistant layer or ion-implantation-resistant layer or an the like is obtained from the chemically amplified resist after being exposed and developed.

According to the present invention, an apparatus for exposing a chemically amplified resist on a semiconductor substrate, comprises, a light source means for generating a light to expose at least a part of the chemically amplified resist on the semiconductor substrate, a chamber for receiving the light source, the chemically amplified resist and the semiconductor substrate, and a chemically amplified resist active gas remover means for removing a gas chemically active on the chemically amplified resist from an inside of the chamber so that the chemically amplified resist reacts to the light from the light source and is prevented from reacting to the gas chemically active on the chemically amplified resist.

According to the present invention, a method for exposing a chemically amplified resist on a semiconductor substrate, comprises, the steps of removing a gas chemically active on the chemically amplified resist from an inside of a chamber receiving a light source, the chemically amplified resist and the semiconductor substrate, and exposing at least a part of the chemically amplified resist on the semiconductor substrate to a light from the light source means so that the chemically amplified resist reacts to the light from the light source and is prevented from reacting to the gas chemically active on the chemically amplified resist.

According to the present invention, since the gas chemically active on the chemically amplified resist is removed from the inside of the chamber so that the chemically amplified resist reacts to the light from the light source and is prevented from reacting to the gas chemically active on the chemically amplified resist, a chemical reaction degree of the chemically amplified resist is controlled only by the light from the light source and is not changed by the gas chemically active on the chemically amplified resist. Therefore, the chemical reaction degree of the chemically amplified resist is correctly controlled so that the correctly-shaped resist (etching-resistant or ion-implantation-resistant) layer is obtained from the chemically amplified resist by being developed after the chemical reaction to the light.

DETAILED DESCRIPTION OF PREFERRED EMBODIMENTS

Figure 1:
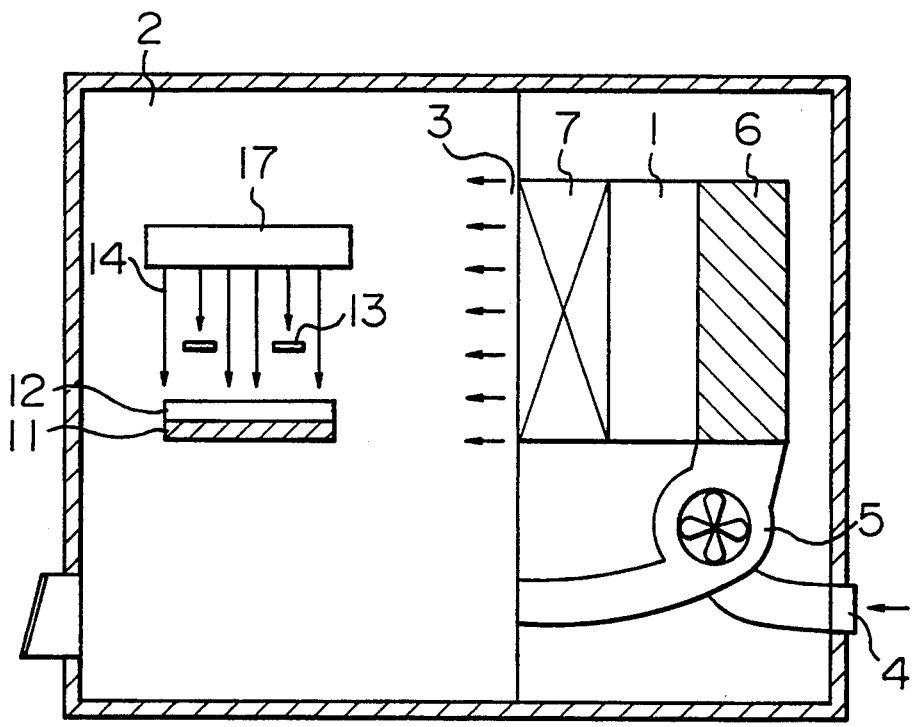
FIG. 1 is a partially cross-sectional view showing an embodiment of the present invention.
Figure 2:
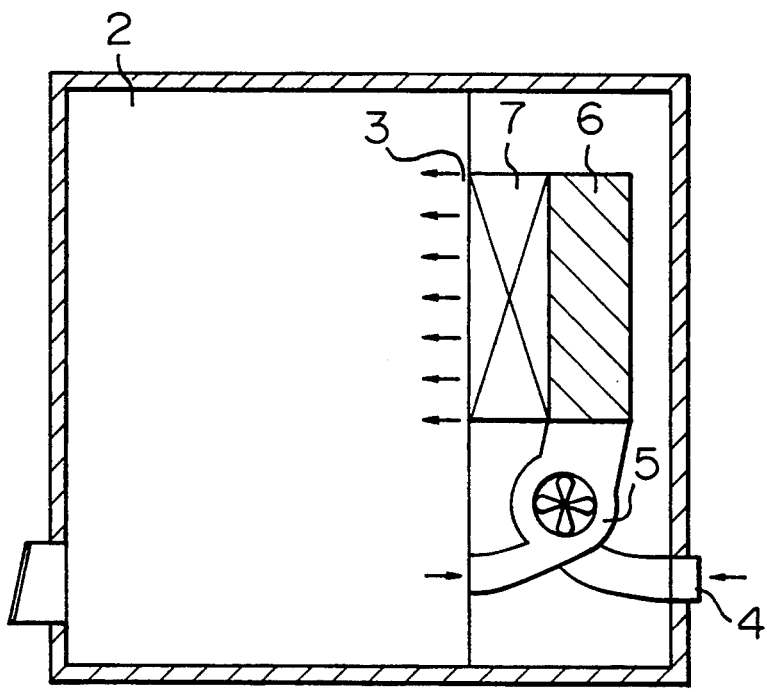
FIG. 2 is a partially cross-sectional view showing a resist exposing apparatus of the prior art.

As shown in FIG. 1, an apparatus for exposing a chemically amplified resist 12 on a semiconductor substrate 11 has a chemically amplified resist active gas remover 1, a light source 17 from which KrF excimer laser light 14 is radiated toward the semiconductor substrate 11, a chamber 2 for receiving the light source 17, the semiconductor substrate 11 with the chemically amplified resist 12 thereon, and a mask 13 for forming a shadow on at least a part of the chemically amplified resist 12 to allow the KrF excimer laser light 14 to reach another part of the chemically amplified resist 12 and to prevent the KrF excimer laser light 14 from reaching the part of the chemically amplified resist 12, a temperature and humidity controller 6 for adjusting a temperature and humidity of a gas (preferably air) supplied into the chamber 2, and a HEPA filter 7 for removing a dust from the air supplied into the chamber 2. When the air is taken from an outside of the chamber 2 into the chamber 2, a pressurizing air pump 5, which acts as gas moving means and gas pressurizing means feeds the air from an inlet 4 through the temperature and humidity controller 6, the chemically amplified resist active gas remover 1 and the HEPA filter 7. Alternatively or simultaneously relative to taking the air from the outside of the chamber 2 into the chamber 2, the air may circulate through the pressurizing air pump 5, the temperature and humidity controller 6, the chemically amplified resist active gas remover 1, the HEPA filter 7 and the chamber 2.

The chemically amplified resist active gas remover 1 includes an alkaline gas absorber and/or an acid gas absorber and/or an organic gas absorber. The alkaline gas absorber, the acid gas absorber and the organic gas absorber come into the market to be obtained easily. Since an alkaline gas and/or an acid gas and/or an organic gas are removed from the inside of the chamber 2 by the chemically amplified resist active gas remover 1, an acid generated from an acid generator material of the chemically amplified resist 12 activated by a light energy from the light source 17 to change a non-alkali-soluble polymer material of the chemically amplified resist 12 to an alkali-soluble polymer does not react to the alkaline gas and/or acid gas and/or organic gas so that an acid concentration or distribution in the chemically amplified resist 12 is not changed by the alkaline gas and/or acid gas and/or organic gas. Therefore, the change of the non-alkali-soluble high polymer material of the chemically amplified resist 12 to the alkali-soluble high polymer is determined or controlled only by the light energy from the light source 17, and is not affected by the alkaline gas and/or acid gas and/or organic gas, so that only the non-alkali-soluble high polymer material in the other part of the chemically amplified resist 12 which the KrF excimer laser light 14 reaches changes to the alkali-soluble high polymer correctly, and the non-alkali-soluble high polymer material in the part of the chemically amplified resist 12 which the KrF excimer laser light 14 does not reach is prevented securely from changing to the alkali-soluble high polymer.

The alkaline gas absorber includes generally a counter agent of, for example, phosphoric acid or orthophosphate, and/or activated charcoal. The acid gas absorber includes generally an oxidizing agent of, for example, potassium permanganate, and activated charcoal or activated alumina. The organic gas absorber includes generally activated charcoal.

Figure 3A:
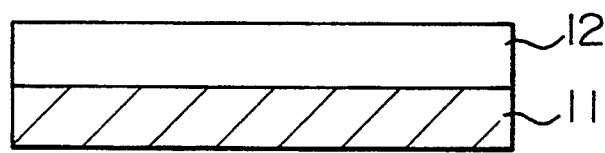
FIGS. 3a–3d are cross-sectional view showing steps for exposing the chemically amplified resist, completing the chemical reaction of the chemically amplified resist by heat energy and developing the chemically amplified resist to form the resist layer.
Figure 3B:
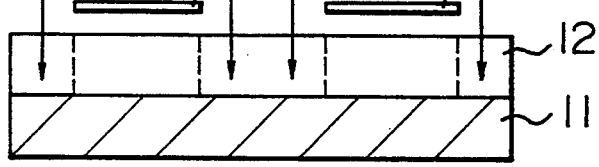
Figure 3C:
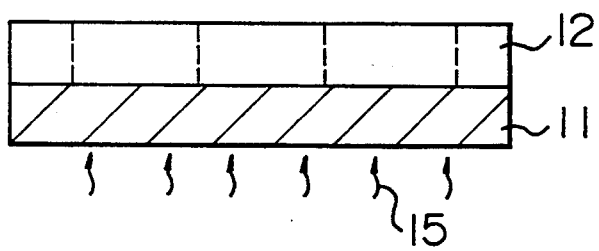
Figure 3D:
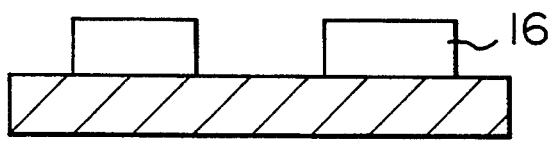

An example of chemically amplified resist usable as the chemically amplified resist 12 is disclosed by "O. Nalamasu et al., Proc. of SPIE, vol. 1466, p. 238 (1991)". Firstly, as shown in FIG. 3a, an upper surface of the semiconductor substrate 11 is coated with the chemically amplified resist 12 by a thickness of 1 μm. Subsequently, as shown in FIG. 3b, the chemically amplified resist 12 on the semiconductive substrate 11 is exposed to the KrF excimer laser light 14 from the light source 17 through the mask 13 so that the part of the chemically amplified resist 12 covered by the shadow is prevented from being exposed or reacted to the KrF excimer laser light 14 and the another part of the chemically amplified resist 12 is allowed to be exposed or reacted to the KrF excimer laser light 14 to generate the acid from the acid generating material of the chemically amplified resist 12 activated by the light energy of the KrF excimer laser 14 to change the non-alkali-soluble high polymer material of the chemically amplified resist 12 to the alkali-soluble high polymer. Subsequently, as shown in FIG. 3c, the chemically amplified resist 12 on the semiconductor substrate 11 is heated (post-exposure-baking) by a heat energy 15 of 100° C. for 90 seconds to complete the change of the non-alkali-soluble high polymer material to the alkali-soluble high polymer over a whole depth or thickness of the chemically amplified resist 12 in the another part of the chemically amplified resist 12. Subsequently, the chemically amplified resist 12 is treated by an alkaline solution of 2.3% for 60 seconds to remove the other part of the chemically amplified resist 12 including the alkali-soluble high polymer from the semiconductor substrate 11 and to leave the part of the chemically amplified resist 12 including the non-alkali-soluble high polymer without the alkali-soluble high polymer so that the chemically amplified resist 12 is developed to change to a resist positive-type (etching-resistant or ion-implantation-resistant) layer 16, as shown in FIG. 3d.

An experimental result for comparing a width of resist layer obtained from the chemically amplified resist by a device or method according to the present invention with a width of resist layer obtained from the chemically amplified resist by a device or method according to the prior art is shown below. One sample with a chemically amplified resist of thickness 1 μm was treated or exposed by the device according to the present invention and another sample with a chemically amplified resist of thickness 1 μm was treated or exposed by the device according to the prior art. Subsequently, both of the samples were kept in the respective devices for 30 minutes. Masks formed shadows on the respective samples, each of which shadows had a stripes-pattern with a line width, of 0.5 μm and a transparent or space width of 0.5 μm. Exposing conditions were common in both of the samples. Subsequently, a post-exposure-baking at 100° C. and for 90 seconds is carried out on both of the samples; thereafter, the samples were developed by a tetramethyl-ammonium-hydride solution (2.3%). The following table shows a measured width of, resist layer obtained from the sample according to the present invention and a measured width of resist layer obtained from the sample according to the prior art. The resist layer obtained according to the present invention has a substantially rectangular shape, and is prevented from becoming trapezoidal or triangular. The resist layer obtained according to the prior art has a trapezoidal or triangular shape.

|  | Present Invention | Prior Art |
| --- | --- | --- |
| Line width of resist layer | 0.50 μm | 0.57 μm |

Line width and space width of stripe pattern of mask: 0.50 μm

According to the present invention, the width of the resist layer is controlled correctly by the width of the mask, and is prevented from being changed by an undesirable gas active on the chemically amplified resist.

What is claimed is:

1. An apparatus for exposing a chemically amplified resist on a semiconductor substrate, the apparatus comprising:

a light source means for generating light to expose at least part of the chemically amplified resist on the semiconductor substrate;

a chamber for receiving the light source means, the chemically amplified resist and the semiconductor substrate;

a chemically amplified resist active gas removing means for removing from a gas a chemically active gas component comprising at least one component selected from the group consisting of an alkaline gas component, an acid gas component and an organic gas component; and a pressurizing means for pressurizing the gas having said chemically active gas component removed therefrom and supplying the gas having said chemically active gas component removed therefrom into the chamber.

2. An apparatus according to claim 1 wherein the chemically amplified resist active gas removing means removes the chemically active gas, when exposing said at least part of the chemically amplified resist on the semiconductor substrate.

3. An apparatus according to claim 1 wherein the chemically amplified resist active gas removing means removes the chemically active gas, before exposing said at least part of the chemically amplified resist on the semiconductor substrate.

4. An apparatus according to claim 1 wherein the chemically amplified resist active gas removing means removes the chemically active gas, after exposing said at least the part of the chemically amplified resist on the semiconductor substrate.

5. An apparatus according to claim 1 wherein the chemically amplified resist active gas removing means comprises activated charcoal and a counter agent taken from the group consisting of phosphoric acid and orthophosphate.

6. An apparatus according to claim 1 wherein the chemically amplified resist active gas removing means comprises potassium permanganate and a composition taken from the group consisting of activated charcoal and activated alumina.

7. An apparatus according to claim 1 wherein the chemically amplified resist active gas removing means comprises activated charcoal.

8. An apparatus according to claim 1 wherein the chemically amplified resist active gas removing means is disposed in a path of the gas between the pressurizing means and the chamber, whereby the gas pressurized by the pressurizing means passes through the chemically amplified resist active gas removing means into the chamber.

9. An apparatus for exposing a chemically amplified resist on a semiconductor substrate, the apparatus comprising:
   a light source means for generating light to expose at least part of the chemically amplified resist on the semiconductor substrate;
   a chamber for receiving the light source means, the chemically amplified resist and the semiconductor substrate; and
   a chemically amplified resist active gas removing means for removing from a gas a chemically active gas component which is chemically reactive with the chemically amplified resist before the gas having the chemically active gas component removed therefrom is supplied into the chamber from an outside of the chamber.

10. An apparatus according to claim 9 wherein the chemically amplified resist active gas removing means comprises activated charcoal and a counter agent taken from the group consisting of phosphoric acid and orthophosphate.

11. An apparatus according to claim 9 wherein the chemically amplified resist active gas removing means comprises potassium permanganate and a composition taken from the group consisting of activated charcoal and activated alumina.

12. An apparatus according to claim 9 wherein the chemically amplified resist active gas removing means comprises activated charcoal.

13. An apparatus for exposing a chemically amplified resist on a semiconductor substrate, the apparatus comprising:
   a light source means for generating light to expose at least part of the chemically amplified resist on the semiconductor substrate;
   a chamber for receiving the light source means, the chemically amplified resist and the semiconductor substrate;
   a chemically amplified resist active gas removing means for removing from a gas a chemically active gas component which is chemically reactive with the chemically amplified resist; and
   gas moving means for taking the gas out of the chamber, supplying the gas to the chemically amplified resist active gas removing means and returning the gas having the chemically active gas component removed therefrom into the chamber.

14. An apparatus according to claim 13 wherein the chemically amplified resist active gas removing means comprises activated charcoal and a counter agent taken from the group consisting of phosphoric acid and orthophosphate.

15. An apparatus according to claim 13 wherein the chemically amplified resist active gas removing means comprises potassium permanganate and a composition taken from the group consisting of activated charcoal and activated alumina.

16. An apparatus according to claim 13 wherein the chemically amplified resist active gas removing means comprises activated charcoal.

17. An apparatus for exposing a chemically amplified resist on a semiconductor substrate, the apparatus comprising:
   a light source means for generating a light to expose at least part of the chemically amplified resist on the semiconductor substrate;
   a chamber for receiving the light source means, the chemically amplified resist and the semiconductor substrate;
   a chemically amplified resist active gas removing means for removing from a gas a chemically active gas component which is chemically reactive with the chemically amplified resist; and
   a temperature and humidity controller for adjusting a temperature and humidity of the gas wherein the chemically amplified resist active gas removing means removes the chemically active gas component after the gas flows through the temperature and humidity controller and before the gas having the chemically active gas component removed therefrom flows into the chamber.

18. An apparatus according to claim 17 wherein the chemically amplified resist active gas removing means comprises activated charcoal and a counter agent taken from the group consisting of phosphoric acid and orthophosphate.

19. An apparatus according to claim 17 wherein the chemically amplified resist active gas removing means comprises potassium permanganate and a composition taken from the group consisting of activated charcoal and activated alumina.

20. An apparatus according to claim 17 wherein the chemically amplified resist active gas removing means comprises activated charcoal.

* * * * *